United States Patent [19]
Rath

[11] Patent Number: 4,916,418
[45] Date of Patent: Apr. 10, 1990

[54] DOUBLE TUNED BIRD CAGE COIL
[75] Inventor: Alan R. Rath, Fremont, Calif.
[73] Assignee: Varian Associates, Inc., Palo Alto, Calif.
[21] Appl. No.: 331,935
[22] Filed: Mar. 31, 1989
[51] Int. Cl.[4] .................................................. G01R 33/20
[52] U.S. Cl. ................................... 333/219; 333/221; 324/318; 324/322
[58] Field of Search ............... 324/300, 307, 309, 318, 324/322; 333/219, 235, 220, 221

[56] References Cited
U.S. PATENT DOCUMENTS 4,680,548  7/1987  Edelstein et al. ............... 324/322 X
4,742,304  5/1988  Schnall et al. .................. 324/322 X
4,820,985  4/1989  Eash ................................... 324/318
4,833,412  5/1989  Zens ................................. 333/219 X Primary Examiner—Eugene R. LaRoche
Assistant Examiner—Seung Ham
Attorney, Agent, or Firm—Stanley Z. Cole; Gerald M. Fisher; Edward H. Berkowitz

[57] ABSTRACT

A multiply tuned bird cage results from the combination of low pass and high pass filter elements to yield a band reject network behaving as a low pass network at a low frequency and a high pass network at a high frequency. A band pass bird cage coil is obtained by adding a parallel LC combination to each leg of a bird cage coil to create additional poles in the impedance curve z(f).

7 Claims, 5 Drawing Sheets

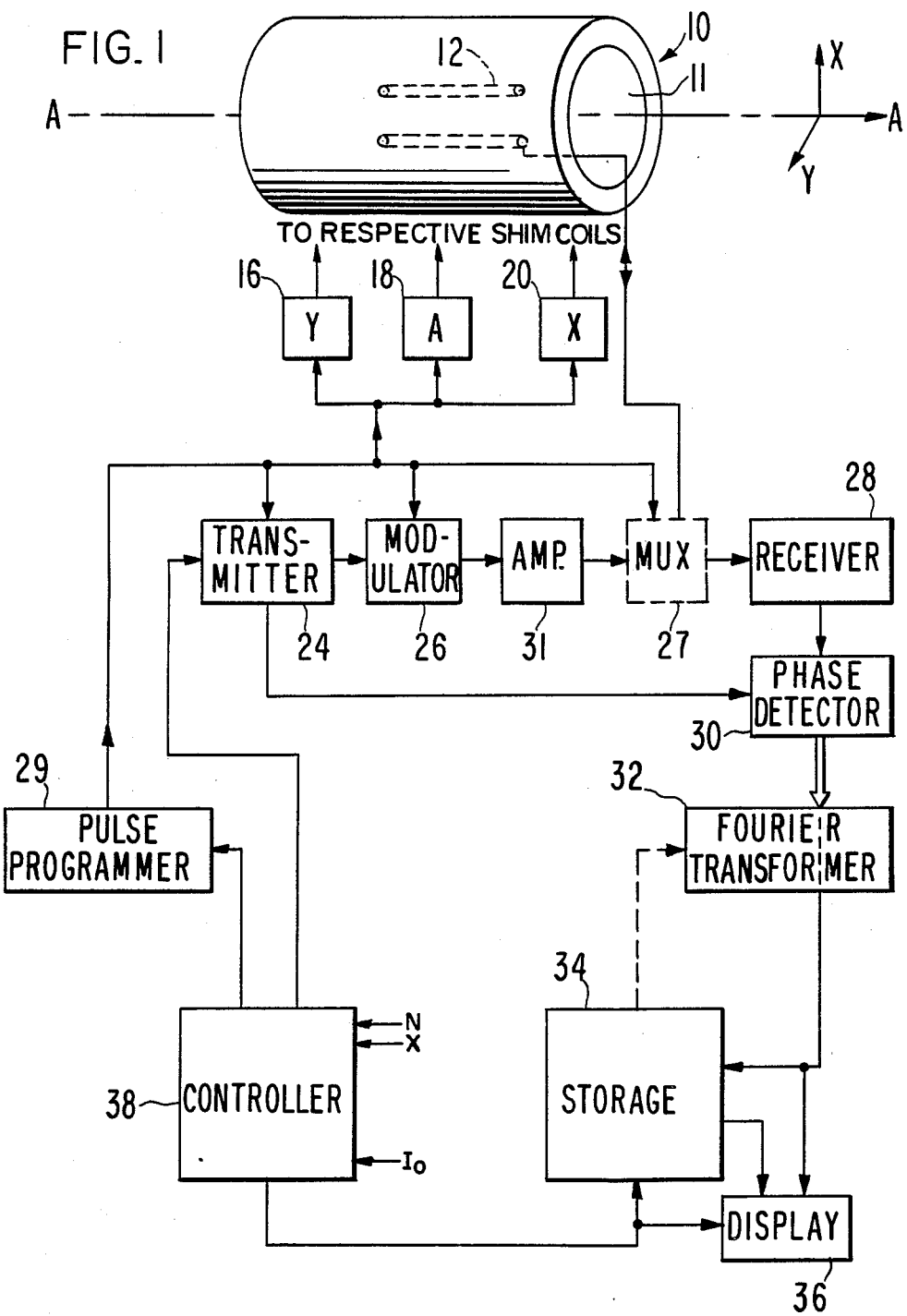

LOW PASS

HIGH PASS

DOUBLE TUNED BIRD CAGE COIL

FIELD OF THE INVENTION

The invention is in the field of nuclear magnetic resonance apparatus and pertains particularly to rf coils for the excitation and observation of resonance.

BACKGROUND OF THE INVENTION

The application of rf radiation to a sample and the pick up of resulting resonant signal is accomplished in a structure surrounding the sample which may be a helical coil, saddle coil, resonant cavity, or a bird cage resonator. The latter structure is the object of the present work, wherein it is desired to obtain multiply resonant frequencies in the same bird cage type structure to facilitate studies of diverse chemical constituents which may be appropriate to the same sample. A bird cage coil is a ladder circuit which closes on itself wherein the current flow around the coil is distributed sinusoidally. As a tuned rf circuit, it is employed in nuclear magnetic resonance apparatus for either or both of the functions of rf excitation and signal detection. Although such coils are well known, all examples known are singly tuned.

The bird cage coil differs in essential matter from saddle coils, helices and like structures by its discrete structure. For the bird cage coil, there is a requirement that the phase shift be discretely distributed around the circumference of the coil from zero to $2\pi$ (or $2\pi n$, where n is an integer). The phase shift of each element is quite frequency dependent and as a consequence, the bird cage coil is tuned at a discrete frequency to achieve the desired phase shift constraint. It is desirable to achieve a multiple tuned bird cage coil in order to obtain data at more than one resonant frequency, either concurrently or in separate measurements.

The bird cage coil is particlarly well suited to large volume samples as are routinely encountered with apparatus for medical imaging and in vivo analytic spectroscopy. Bird cage coils are discussed by Hayes et al, J. Mag. Res., vol. 63, pp. 622–628 (1985).

The bird cage structure may be regarded as a periodic structure which closes on itself. Periodic elements of the structure produce phase shifts which must aggregate to some multiplie of $2\pi$ when summed over the closed loop. Geometrically, the resonator has cylindrical symmetry and it is desired that the rf current in the axial direction along the periphery of the structure be proportional to $\sin\theta$ where $\theta$ is the azimuthal angle about the cylindrical axis.

BRIEF DESCRIPTION OF THE INVENTION

In a first embodiment, a double tuned bird cage coil is realized in creating simultaneously high pass and low pass subnetworks of the constituents of the bird cage structure.

In a secnd embodiment, multiple fundamental mode resonance conditions are achieved by creating an additional pole(s) in the impedance characteristic of a bird cage resonator through addition of parallel LC reactive combinations to the elements of a bird cage resonator.

BRIEF DESCRIPTION OF THE DRAWINGS

FIG. 1 is a schematic illustration for the context of the invention.

FIG. 3d is a combination of FIGS. 3b and 3c forming an element as a circuit of FIG. 3a.

FIG. 4b is a hydrogen image of the phantom of FIG. 4a.

DETAILED DESCRIPTION OF THE APPARATUS

Figure 2A:
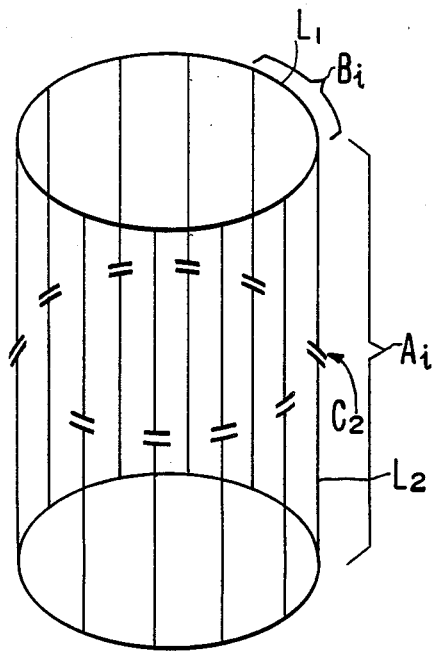
FIG. 2a is a perspective of an exemplar (low pass) bird cage coil of prior art.

The physical context of the invention is an NMR apparatus. An idealized illustration is shown in FIG. 1.

A magnet 10 having bore 11 provides a main magnetic field. In order to control the magnetic field with precision in time and direction, there are provided magnetic field gradient coils (not shown). These are driven by gradient power supplies 16, 18 and 20, respectively. Additionally, other gradient coils (not shown) and power supplies (not shown) may be required for compensating residual undesired spatial inhomogeneities in the basic magnetic field. An object for analysis (hereinater "sample") is placed within the magnetic field in bore 11 and the sample is subject to irradiation by rf power, such that the rf magnetic field is aligned in a desired orthogonal relationship with the magnetic field in the interior of bore 11. This is accomplished through a transmitter coil 12 in the interior of bore 11. Resonant signals are induced in a receiver coil, proximate the sample within bore 11. The transmitter and receiver coils may be the identical structure, or separate structures.

As shown in FIG. 1, rf power is provided from transmitter 24, modulated through modulator 26 to yield modulated pulses (amplitude or frequency or phase or combinations thereof) or the rf power which are amplified by amplifier 31 and thence directed via multiplexer 27 to the rf transmitter coil 12 located within bore 11. Transmitter and receiver coils are clearly not concurrently active as such. The identical coil may be employed for both functions if so desired. Thus, a multiplexer 27 is provided to isolate the receiver from the transmitter. In the case of separate transmitter and receiver coils, element 27, while not precisely a multiplexer, will perform a similar isolation function to control receiver operation.

The modulator 26 is controlled by pulse programmer 29 to provide rf pulses of desired amplitude, duration and phase relative to the rf carrier at preselected time intervals. The pulse programmer may have hardware and/or software attributes. The pulse programmer also controls the gradient power supplies 16, 18 and 20, if such gradients are required. These gradient power supplies may maintain selected static gradients in the respective gradient coils if so desired.

The transient nuclear resonance waveform is processed by receiver 28 and further resolved in phase quadrature through phase detector 30. The phase resolved time domain signals from phase detector 30 are presented to Fourier transformer 32 for transformation to the frequency domain in accordance with specific requirements of the processing. Conversion of the analog resonance signal to digital form is commonly carried out on the phase resolved signals through analog to digital converter (ADC) structures which may be regarded as a component of phase detector 30 for convenience.

It is understood that Fourier transformer 32 may, in practice, act upon a stored (in storage unit 34) representation of the phase resolved data. This reflects the common practice of averaging a number of time domain phase resolved waveforms to enhance the signal-to-noise ratio. The transformation function is then applied to the resultant averaged waveform. Display device 36 operates on the acquired data to present same for inspection. Controller 38, most often comprising one or more computers, controls and correlates the operation of the entire apparatus.

The subject matter of the present invention is a special structure for the transmitter or receiver coil 11. Physically, a low pass bird cage coil of prior art may be identified with the perspective sketch of FIG. 2a and electrically, with the network of FIG. 2b. The paraxial extending, or longitudinal members $A_i$ are series LC components, the series inductance $L_2$ for which is generally distributed over the length of conductor, or longitudinal bar. Each adjacent pair of bars $A_i$ and $A_{i-j}$ are coupled to form a parallel array of the bars $A_i$ via annular coupling elements $B_i$ comprising the inductance of the coupling element.

Figure 2B:
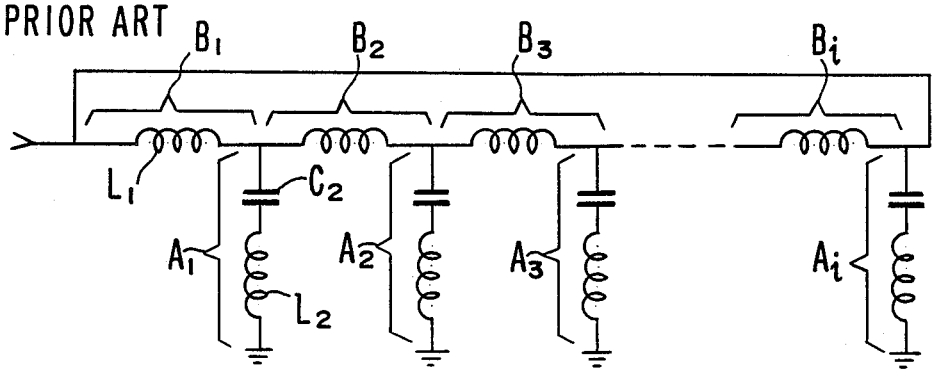
FIG. 2b is an equivalent circuit of the prior art of FIG. 2a. p
Figure 2C:
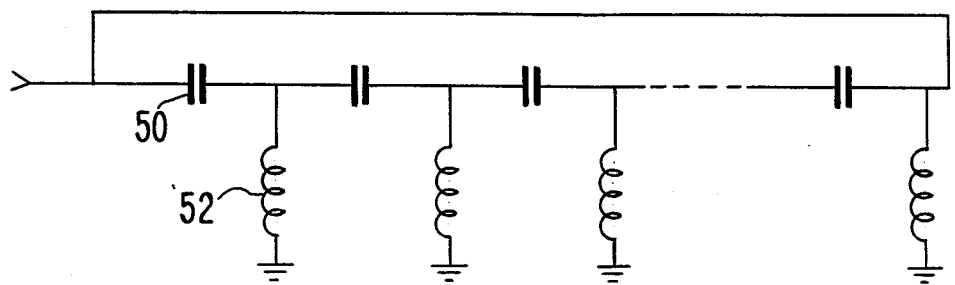
FIG. 2c is an equivalent circuit for a high pass structural analogous to FIG. 2b.
Figure 3A:
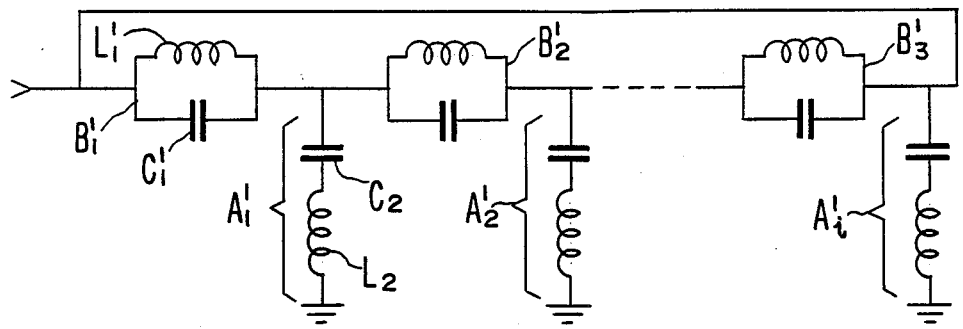
FIG. 3a is an equivalent circuit diagram of one embodiment of the invention.
Figure 3B:
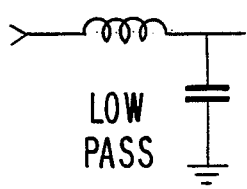
FIG. 3b is an example equivalent low pass section.
Figure 3C:
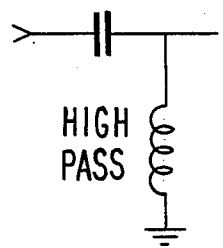
FIG. 3c is an example equivalent high pass section.
Figure 3D:
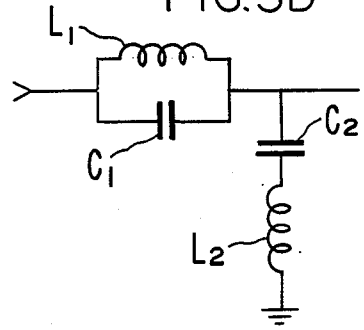

The elementary exposition of the first embodiment is shown in the network of FIG. 3a. The longitudinal axially extending bars of the bird cage are, in this instance, each subcircuits of series LC combinations $A1'$, $A2'$, ... $Ai'$ of FIGS. 2a and 2b and the annular end face coupling elements $B_1'$, $B_2'$, ... $B_i'$ of the bird cage are parallel of LC combinations. The basic unit of the embodiment, as shown in FIG. 3d, is equivalent in practical performance at low frequency to the circuit of FIG. 3b and equivalent in practical performance at high frequency to the circuit of FIG. 3c. The response of the circuit shown in FIG. 3d, at low frequencies, provides a substantially inductive impedance through the $L_1 C_1$ combination and the series $L_2 C_2$ combination is substantially a capacitive impedance.

For frequencies higher than resonance, the opposite situation obtains. Thus, the bird cage coil of the invention appears as a low pass network for supporting a low frequency fundamental mode (phase shifts of zero to $2\pi$ for the corresponding azimuthal range zero to $2\pi$) while similarly functional as a high pass network for support of a high frequency fundamental mode. This behavior is in fact analogous to that exhibited by a simple band reject filter. Thus, bird cage coils constructed from sections exhibiting band reject characteristics are referenced hereafter as band reject bird cage coils. FIG. 3a is a simple example of such a band reject bird cage coil.

It may be shown that the resonant frequency(s) for the conventional low pass bird cage coil of FIG. 2b satisfies the relation $$\omega^2 L_1 C_2/(1-\omega^2 L_2 C_2) = 4 \sin^2 A \quad A = \pi M/N \qquad \text{Equ. 1}$$

where M is an integer, $1 \leq M < N/2$, N=number of axial members of the bird cage coil. The integer M numbers the mode of low pass operation.

The resonant frequencies corresponding to the first embodiment may be derived from equation 1 by substituting for $L_1$ the expression $L_1'$ where $L_1' = L_1[1/(1-\omega^2 L_1 C_1)]$ to take account of the resulting impedance in the parallel combination.

An example double tuned bird cage coil of the above description (8 stages) was constructed with the values of capacitance $C_1 = 47$ pf and $C_2 = 27$ pf. The longitudinal inductances $L_2$ were each furnished by 12 cm of #10 copper wire and the end face inductances, or ring coupling elements were each furnished by 4 cm of #18 copper wire. In overall dimensions, the coil was 15 cm in length with a diameter of about 10 cm.

Figure 4A:
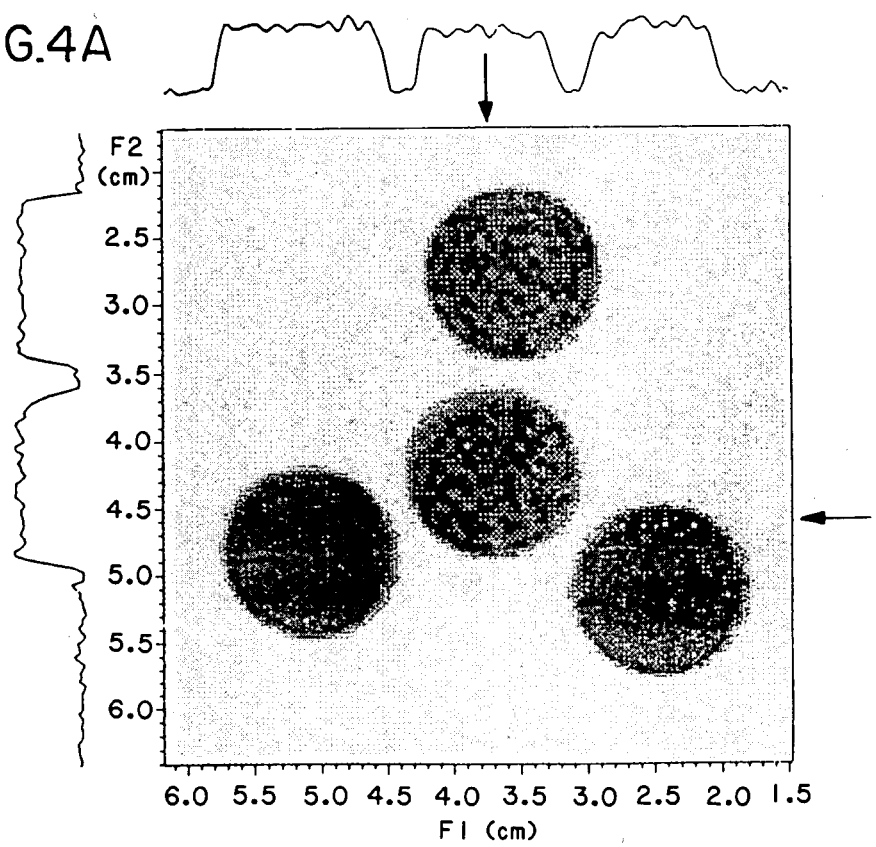
FIG. 4a is a $P^{31}$ image of a phantom.
Figure 4B:
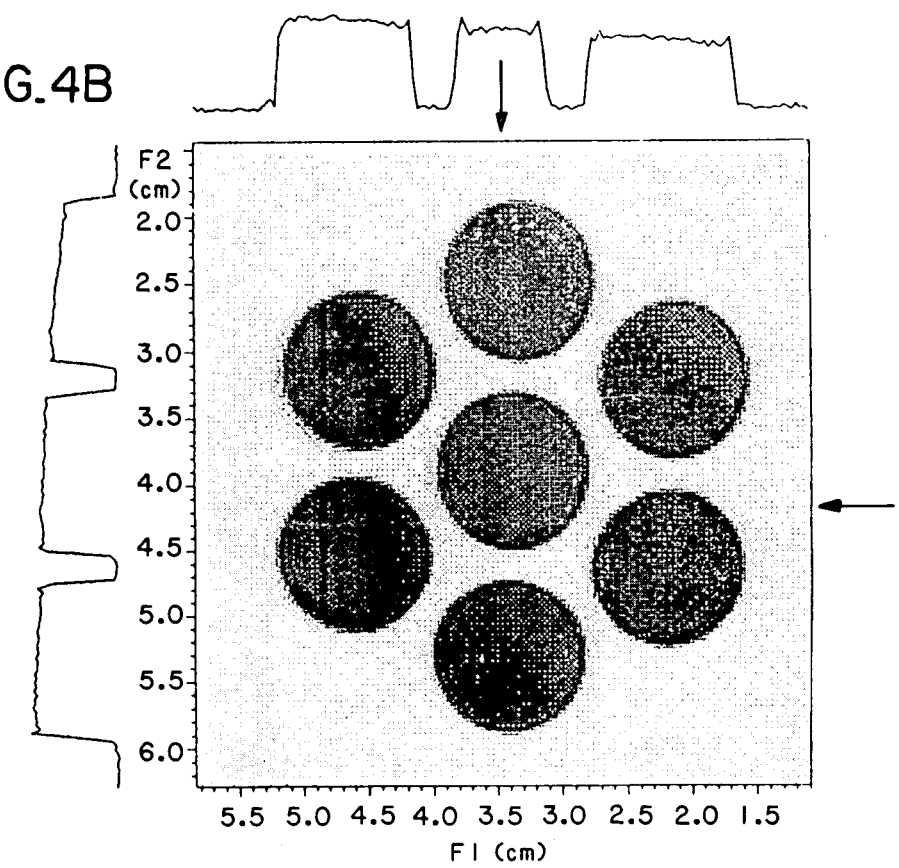

With this coil, the high frequency fundamental mode resonance occurs at about 200 MHz and low frequency fundamental mode occurs at 81 MHz. These frequencies were selected for hydrogen and phosphorus resonances appropriate to a 4.7 Tesla magnetic field. A phantom was constructed of a hexagonally packed array of seven vials, four of which contained a phosphate solution, the remainder containing only water. The resulting images at 81 MHz and 200 MHz are shown respectively at FIG. 4a and FIG. 4b.

Cuts were taken through the two paramenter data at the values indicated by the arrows on each axis at each fundamental mode frequency. These are displayed on the corresponding axes and demonstrate that the field distribution within the bird cage coil is substantially uniform.

Figure 5A:
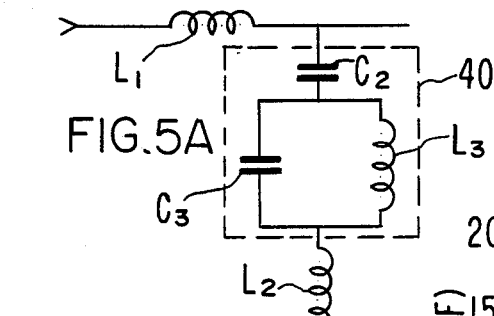
FIG. 5a is a section of a low pass bird cage coil supplemented with an L-C parallel subnetwork.

In a second embodiment, each of the series L-C elements (legs) $A_i$ of a basic low pass bird cage coil of FIG. 2b are supplemented by a parallel L-C combination to obtain the bird cage coil section of FIG. 5a.

Figure 5B:
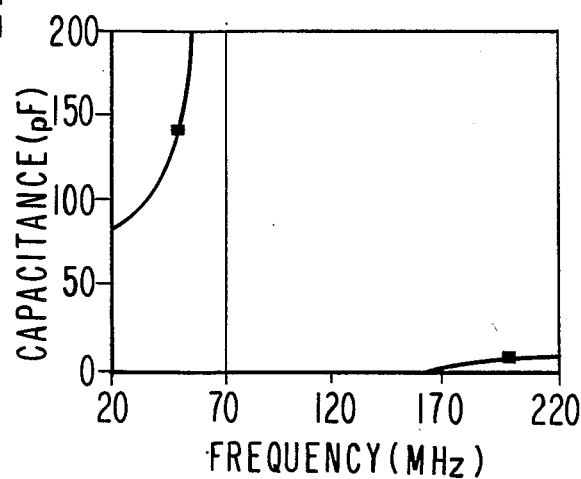
FIG. 5b shows the frequency response of the $C_2$-$L_3$-$C_3$ portion of FIG. 5a for example components.

The effect of the parallel LC addition alters the behavior of the $C_2$-$L_2$ leg, that is the impedance of capacitor $C_2$ of FIG. 2b is now replaced by the effective impedance of the $C_2$-$L_3$-$C_3$ combination 40. Choosing $C_2 = 80$ pf, $C_3 = 20$ pf and $L_3 = 50$ $\mu$H yields the effective frequency dependent capacitance shown in FIG. 5b. The effective capacitance at 50 MHz is approximately 143 pF and at 200 MHz is about 7 pF. In the context of a bird cage coil using this approach, one may achieve both a low pass fundamental resonance at a low frequency and another high frequency low pass fundamental resonance at a high frequency. Thus, the network of FIG. 5a is an example of the class of band pass filters. Bird cage coils employing band pass sections are referenced hereater as band pass bird cage coils.

Defining the equivalent capacitance $C_{eq}$ $$C_{eq} = \frac{1}{\omega^2[L_3/\omega^2 L_3 C_3 - 1] + 1/C_2}$$

one obtains the expression $$\frac{\omega^2 L_1 C_{eq}}{[1 - \omega^2 L_2 C_{eq}]} = 4 \sin^2 A \qquad \text{eq. 2}$$

which may be expanded to yield a quadratic in $\omega^2$. The solutions give two distinct roots $\omega_L^2$ and $\omega_H^2$ corresponding to two fundamental mode resonant frequencies. (These roots are degenerate and correspond to opposite circular polarization states.)

As a practical matter, the roots $\omega_L$ and $\omega_H$ may be used to calculate the desired capacitances $C_2$ and $C_3$. Following equation 2, one may write coupled equations separating the capacitances $C_2$ and $C_3$ in the form $$f_2(\omega_L, L_1, L_2, L_3, C_3) = 0$$

$$f_3(\omega_H, L_1, L_2, L_3, C_2) = 0$$

where $\omega_H$ and $\omega_L$ are the respective high and low frequency roots of the quadradic in $\omega^2$. When expanded, one obtains, for example a quadradic in $C_3$ determining pairs of values for $C_3$ and $C_2$.

In one example, let $L_1 = 10$ $\mu$H, $L_2 = 50$ $\mu$H, $L_3 = 50$ $\mu$H and $\omega_L = 50$ MHz and $\omega_H = 200$ MHz. Using the negative root of the quadradic in $C_3$, one obtains $$C_2 = 81.99 \text{ pF and } C_3 = 23.335 \text{ pF. (negative root)}$$

and using the positive root one obtains $$C_2 = 9.966 \text{ pF and } C_3 = 191.972 \text{ pF. (positive root)}$$

Figure 6A:
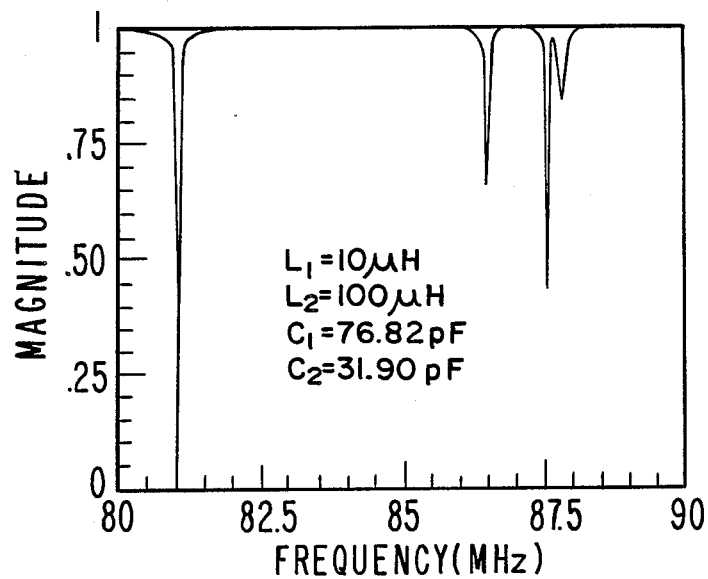
FIGS. 6a and 6b show the response of a band reject bird cage over the frequencies of interest.
Figure 6B:
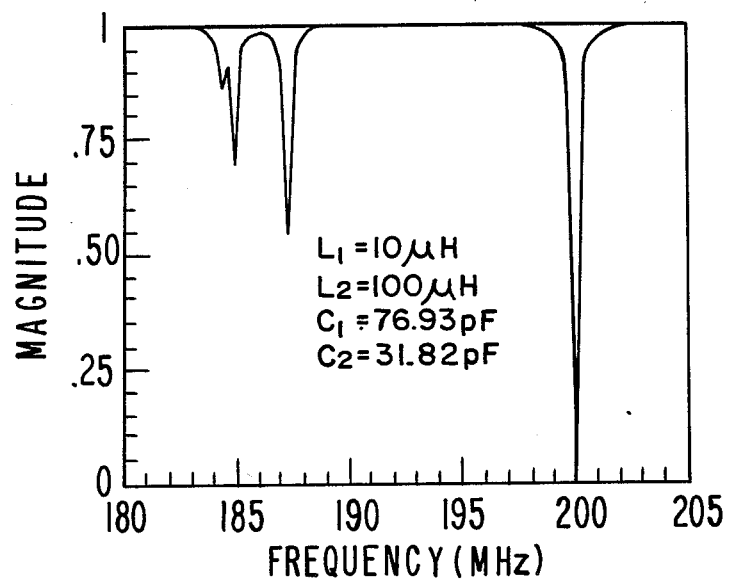

Under these conditions one obtains the given low and high fundamental resonant frequencies together with higher order frequencies corresponding to the boundary condition on phase shift $\delta$ over the coil, e.g. $\delta = 2\pi M$. For the negative roots of $C_3^2$ the corresponding poles may be seen in FIGS. 6a and 6b. These figures show the computed resonse for the case $L_1 = 10$ $\mu$H, $L_2 = 100$ with the RF source coupled by mutual inductance to the coils. In the figures the capacitances $C_1$ and $C_2$ differ insignificantly for the two RF frequencies. The mutual inductive coupling inductance and coupling constant have been optimized. Capacitance coupling of the RF has been investigated for the same coils with the results that the low frequency (low pass) resonances are substantially unaffected by the form of coupling. The high pass resonances has noticeable effect, producing slight shifts of the higher order resources toward higher freuency (~0.5 MHz).

The frequencies associated with the positive root of $C_3^2$ are more closely spaced than is desirable for application where isolation of the fundamental mode from higher order modes is important.

Figure 5C:
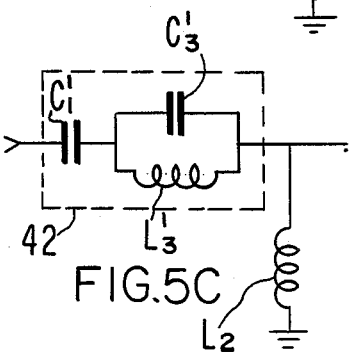
FIG. 5c is an annular coupling segment of a high pass bird cage coil supplemented with an LC parallel subnetwork.

In analogy to the band pass bird cage coil embodiment of FIG. 5a wherein the $L_3$-$C_3$ combination suppliements the leg capacitance $C_2$ of a general low pass bird cage coil, a similar embodiment is realized by supplementing the capacitance 50 of a ring coupling portion of a high pass bird cage coil with an LC combination as shown in FIG. 5c.

Although this invention has been described with reference to particular embodiments and examples, other modifications and variations will occur to those skilled in the art in view of the above teachings. Then it should be understood that within the scope of the appended claims, this invention may be practiced otherwise than as specifically described.

What is claimed is:

1. A band reject bird cage coil for providing a substantially uniform rf field in the cylindrical interior space thereof and exhibiting at least lower and higher fundamental resonant frequencies comprising:
    a plurality of leg conductors disposed spaced from an axis and parallel therewith, said plurality of leg conductors defining an active volume;
    a plurality of annular conductors disposed about said axis and coupling adjacent said leg conductors;
    said leg conductors exhibiting a substantially capacitive impedance at frequencies at and below the lower resonant frequency and a substantially inductive impedance at frequencies substantially at and greater than said higher resonant frequency and said annular portion conductors exhibiting a substantially inductive impedance at frequencies substantially at and below said lower resonant frequency and a substantially capacitive impedance at frequencies substantially at and above said higher resonant frequency.

2. The bend reject bird cage coil of claim 1 wherein each said plurality of annular conductors comprises an effective parallel coupled inductive and capacitive combination of selected value and each said plurality of leg conductors comprising an effective series inductive and capacitive combination of selected value.

3. The band reject bird cage coil of claim 2 further comprising matching means for coupling an RF power source of selected impedance to said bird cage coil.

4. A band pass bird cage coil for providing a substantially uniform rf field in the cylindrical interior space thereof and exhibiting at least lower and higher fundamental resonant frequencies comprising:
    a plurality of leg conductors disposed spaced from an axis and parallel therewith, said plurality of conductors defining an active volume;
    a plurality of annular conductors disposed about said axis and coupling adjacent said leg conductors;
    said leg conductors comprising a first inductance of selected value and a first capacitance of selected value in parallel combination and a second capacitance and a second inductance forming a series combination, said series combination in series with said parallel combination, and said annular conductors comprising a substantially inductive impedance at each said resonant frequency.

5. The band pass bird cage coil of claim 3 further comprising matching means for coupling an RF power source of selected impedance to said bird cage coil.

6. A band reject bird cage coil for providing a substantially uniform rf field in the cylindrical interior space thereof and exhibiting at least lower and higher fundamental resonant frequencies comprising:
    a plurality of leg conductors disposed spaced from an axis and parallel therewith, said plurality of conductors defining an active volume;
    a plurality of annular conductors diposed about said axis and coupling adjacent said leg conductors;
    each said annular portion conductor comprising a first capacitance and first inductance in parallel combination and a second capacitance in series with said parallel combination and each said leg conductors comprising a substantially inductive impedance at each said resonant frequency.

7. The band reject bird cage coil of claim 5 further comprising matching means of coupling an RF power source of selected impedance to said bird cage coil.

* * * * *